United States Patent
Gualco et al.

(10) Patent No.: US 12,212,260 B2
(45) Date of Patent: Jan. 28, 2025

(54) CONTROL CIRCUIT FOR AN ELECTRIC MOTOR AND CONTROLLING METHOD THEREOF

(71) Applicant: ETEL S.A., Motiers (CH)

(72) Inventors: Gabriele Gualco, Sassel (CH); Pierre Hirsig, Neuchatel (CH)

(73) Assignee: ETEL S.A., Motiers (CH)

( * ) Notice: Subject to any disclaimer, the term of this patent is extended or adjusted under 35 U.S.C. 154(b) by 275 days.

(21) Appl. No.: 17/889,392

(22) Filed: Aug. 17, 2022

(65) Prior Publication Data

US 2023/0062820 A1  Mar. 2, 2023

(30) Foreign Application Priority Data

Aug. 30, 2021 (EP) ..................... 21193885

(51) Int. Cl.
| | | |
|---|---|---|
| H02P 25/06 | (2016.01) | |
| G01R 19/00 | (2006.01) | |
| H03K 3/037 | (2006.01) | |
| H03M 1/18 | (2006.01) | |

(52) U.S. Cl.
CPC .......... *H02P 25/06* (2013.01); *G01R 19/0092* (2013.01); *H03K 3/037* (2013.01); *H03M 1/18* (2013.01)

(58) Field of Classification Search
CPC . H02P 25/06; H02P 2205/01; G01R 19/0092; H03K 3/037; H03M 1/18
See application file for complete search history.

(56) References Cited

U.S. PATENT DOCUMENTS

| | | | | |
|---|---|---|---|---|
| 6,057,664 A | * | 5/2000 | Ikawa | ..................... H02P 21/22 318/811 |
| 6,469,461 B1 | * | 10/2002 | Konda | ..................... H02P 6/34 318/400.21 |
| 7,443,129 B2 | * | 10/2008 | Biribauer | ................ H02M 1/32 363/40 |
| 8,629,634 B2 | * | 1/2014 | Redler | ..................... H02P 5/52 318/434 |

(Continued)

FOREIGN PATENT DOCUMENTS

| | | | | |
|---|---|---|---|---|
| EP | 2388599 A2 | * | 11/2011 | ......... G01R 19/0092 |
| JP | 2011254561 A | | 12/2011 | |
| JP | 5556353 B2 | | 7/2014 | |

*Primary Examiner* — Thai T Dinh
(74) *Attorney, Agent, or Firm* — LEYDIG, VOIT & MAYER, LTD.

(57) ABSTRACT

A control circuit for an electric motor includes low and high voltage subcircuits, and an isolation barrier therebetween. The low voltage subcircuit comprises a current controller configured to generate a driving signal, and a feedback loop. The high voltage subcircuit comprises a power bridge configured to output a current that drives the motor, a current sensor configured to measure the current, an analog front-end and an analog-to-digital converter (ADC). The analog front-end is configured to apply as a function of the measured current. The isolation barrier comprises an isolator having: first and second channels to pass respectively a clock signal and a control signal from the low to high voltage subcircuit to select the gain; and third and fourth channels to pass respectively an output signal of the ADC and a replica of the clock signal from the high to low voltage subcircuit.

12 Claims, 5 Drawing Sheets

(56) References Cited

U.S. PATENT DOCUMENTS

| | | | |
|---|---|---|---|
| 8,860,354 B2 | 10/2014 | Blanc et al. | |
| 9,214,889 B2 * | 12/2015 | Sano | H02P 27/06 |
| 9,383,734 B2 | 7/2016 | Kirshenboim et al. | |
| 9,692,332 B2 * | 6/2017 | Taoka | H02P 1/029 |

* cited by examiner

CONTROL CIRCUIT FOR AN ELECTRIC MOTOR AND CONTROLLING METHOD THEREOF

CROSS REFERENCE TO RELATED APPLICATIONS

This application claims benefit to European Patent Application No. EP 21193885.7, filed on Aug. 30, 2021, which is hereby incorporated by reference herein.

FIELD

The present invention relates to the field of electric motors and more particularly to a control circuit for an electric motor and a motor comprising such control circuit. The present invention further relates to a method for controlling the control circuit to achieve precise and accurate driving of electric motors.

BACKGROUND

Electric motors used in various industrial installations are often controlled to achieve a target position. In this context, a feedback loop is used to modify the actual position of a moving part of the motor such that it corresponds to the target position. The difference between the actual position and the target position is processed by an electronic control unit, which determines a target supply current. The control unit of the motor is therefore adapted to supply the motor (each of its phases) in such a way as to generate a supply current corresponding to the target supply current to achieve high precision positioning of the moving part of the motor.

U.S. Pat. No. 8,860,354B2 discloses a control circuit for an electric motor, which is configured to generate via a first digital-to-analog converter, a control signal for driving the electric motor. The control circuit comprises a low-voltage zone and a high-voltage zone. The low-voltage zone comprises a control unit while the high-voltage zone comprises a current sensor for measuring the current supply to the electric motor and an analog-to-digital converter (ADC) to convert the analog signal into a corresponding digital signal which is sent to the control unit. A galvanic separating element is provided between the low and high-voltage zones for security reasons.

In order to achieve the required performance, the noise level on the output current $I_{output}$ is crucial and is usually expressed in µArms. The noise level is directly linked to the current measurement's least significant bit (LSB) resolution. The smaller the LSB resolution, the better is the noise. The LSB resolution may be reduced in three different ways:
- the number of bits of the ADC can be increased. This has an immediate impact on the LSB resolution but impacts negatively the overall cost,
- a fast ADC with a limited number of bits may be used and an average from multiple current measurement samples can be calculated. This is equivalent to increasing the number of bits of the ADC, with the advantage that fast low-resolution ADC are usually cheaper than slow high-resolution ones. The gain in resolutions comes at expense of a bigger lag in the feedback loop, limiting again the dynamic performances of the driven motor, or
- the current sensor maximum current level can be reduced, thereby having an immediate positive impact on the LSB resolution. Reducing the sensor maximum current level has however a negative impact on the dynamic performances (e.g. acceleration, speed, torque) of the driven motor because large currents cannot be measured.

However, large currents are not required through the whole operating range of the motor. When the motor is at standstill or running at constant speed, the current intensities are significantly smaller than the maximum drive current usually required during acceleration phases of the motor. Different driving modes may therefore be implemented according to the operating range of the motor.

U.S. Pat. No. 9,383,734 discloses for example a control circuit for feedback-based control of motion and positioning of a motor. The control circuit comprises a current measurement device configured to obtain a measurement of the current in the phase load of the motor to provide feedback. The intensity of the current in the phase load varies within an operating range which is made up of a relatively large current range for the acceleration phase of the motor and of relatively smaller current range when the motor is at standstill or running at constant speed. The current measurement device has a first coarse sensor optimized for measuring the relatively large current range and a second fine sensor optimized for measuring the relatively smaller current range, thereby maximizing feedback accuracy when the motor is at standstill or running at constant speed.

SUMMARY

In an embodiment, the present invention provides a control circuit for an electric motor having at least one phase. The control circuit includes low and high voltage subcircuits, and an isolation barrier therebetween. The low voltage subcircuit comprises a current controller configured to generate a driving signal, and a feedback loop having an output that is fed back to an input of the current controller. The high voltage subcircuit comprises a power bridge configured to output a current that drives the at least one phase of the motor, a current sensor configured to measure the current in the at least one phase, an analog front-end and an analog-to-digital converter (ADC). The analog front-end is configured to apply a first gain or a second gain that is higher than the first gain as a function of the current in the at least one phase measured by the current sensor. The isolation barrier comprises an isolator configured to pass an output signal of the ADC across the isolation barrier from the high voltage subcircuit to the low voltage subcircuit. The isolator comprises: a first and a second channel to pass respectively a clock signal and a control signal from the low voltage subcircuit to the high voltage subcircuit to select the first or second gain of the analog front-end; and a third and a fourth channel to pass respectively the output signal of the ADC and a replica of the clock signal from the high voltage subcircuit to the low voltage subcircuit.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
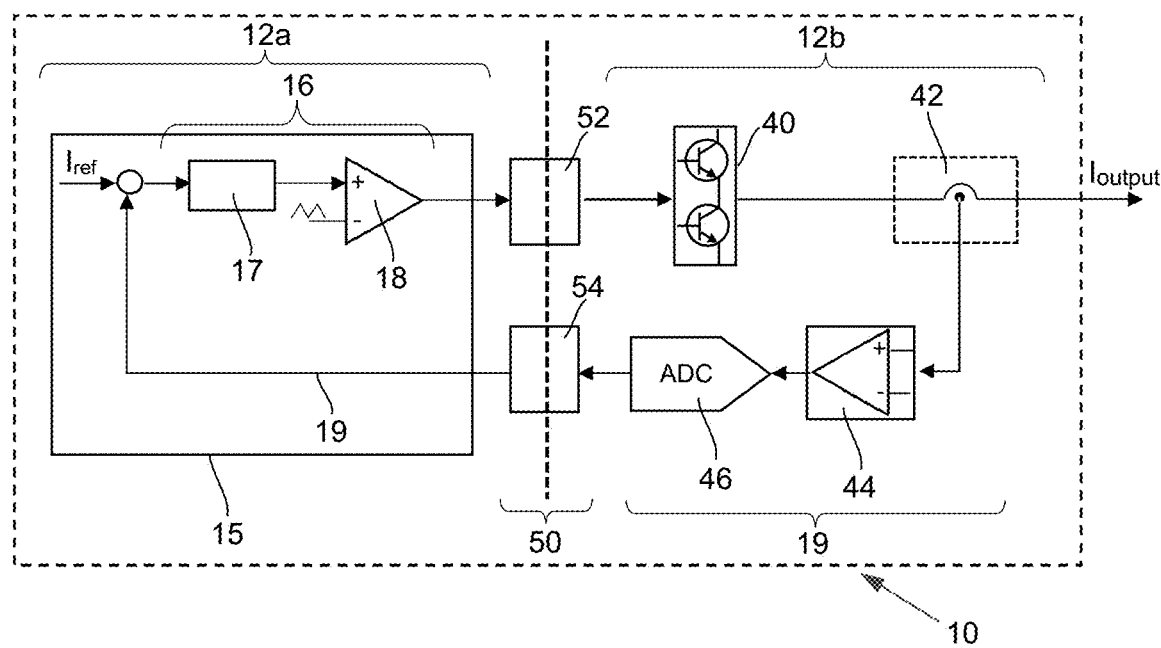
FIG. 1 shows a simplified block diagram of the control circuit for driving an electric motor according to an embodiment.

In an embodiment, the present invention provides an alternative control circuit, for driving an electric motor, which optimizes the current feedback as a function of the operating range of the electric motor.

In the same or another embodiment, the present invention provides a control circuit with high and low voltage subcircuit separated by a galvanic isolation and adapted to use an isolator with a limited number of channels to pass control data across the galvanic isolation barrier for selecting low or high gain driving modes.

Using an isolator with limited number of channels has the advantage to be cost-effective and compact.

In an embodiment, the present invention provides a control circuit for an electric motor comprising at least one phase. The control circuit optimizes the current feedback as a function of the operating range of the electric motor and is adapted to use an isolator with a limited number of channels to pass control data across the galvanic isolation barrier for selecting low or high gain driving modes. The control circuit comprises a low voltage subcircuit, a high voltage subcircuit and an isolation barrier between the low voltage and high voltage subcircuits. The low voltage subcircuit comprises a current controller adapted to generate a driving signal, and a feedback loop whose output is fed back to the input of the current controller. The high voltage subcircuit comprises a power bridge to output a current for driving the at least one phase of the motor, a current sensor for measuring the current in the at least one phase, an analog front-end and an analog-to-digital converter (ADC). The isolation barrier comprises an isolator adapted to pass the output signal of the ADC across the isolation barrier from the high voltage subcircuit to the low voltage subcircuit. The analog front-end is adapted to apply a first gain or a second gain that is higher than the first gain as a function of the current in the at least one phase measured by the current sensor.

The isolator comprises a first and a second channel to pass respectively a clock signal and a control signal from the low voltage subcircuit to the high voltage subcircuit in order to select the first or second gain of the analog front-end. The isolator comprises a third and a fourth channel to pass respectively the output data of the ADC and a replica of the clock signal from the high voltage subcircuit to the low voltage subcircuit.

In an embodiment, the high voltage subcircuit further comprises a D flip-flop. The clock input of the D flip-flop is arranged to receive the control signal and the input of the D flip-flop is arranged to receive the clock signal. The output of the D flip-flop is used for selection of either first or second gain of the analog front-end as a function of the clock signal.

In an embodiment, the high voltage subcircuit further comprises a multiplexer comprising two data inputs and a selector input, wherein one of the two data inputs is arranged to receive the clock signal, the other of the two data inputs is arranged to receive the output of the D flip-flop. The selector input is arranged to receive the control signal such that either the selected gain or the replica of the clock signal may be passed via the fourth channel of the isolator based on the state of the control signal.

In an embodiment, the feedback loop of the low voltage subcircuit comprises a deserializer arranged to receive serial data from the ADC, representing the current value measured by the current sensor, as an input to convert the serial data into a single value encoded on M bits. The feedback loop also comprises a register shifter for changing the value of said M bits if the selected first or second gain differs from the gain applied to said current value.

In an embodiment, the feedback loop further comprises an accumulator arranged to add up different samples of currents measured by the current sensor, a decimator filter for sampling N current samples and a division element for outputting a moving average of the current measurements.

In an embodiment, the feedback loop further comprises a clock generator arranged to generate a first or a second clock signal as a function of the selected first or second gain. The selection of the first or second gain is based on the current measured by the current sensor.

In an embodiment, the clock generator is arranged to adapt the first and second clock signals, when the current measured by the current sensor is between a first and a second current thresholds, such that the moving average of the current measurement outputted by the division element is made up of current samples measured with the first gain and current samples measured with the second gain during a transition phase from a low to a high gain driving mode or from a high to a low gain driving mode.

Another embodiment of the invention provides an electric motor comprising the control circuit as described above.

A further embodiment of the invention provides a method for controlling the control circuit for an electric motor, comprising the steps of measuring the current flowing in the at least one phase of the electric motor, and controlling the front analog front-end such that:

i) its gain corresponds to the first gain as long as the current measured is below a first current threshold value, ii) its gain corresponds to the second gain as long as the current measured is above a second current threshold value, iii) its gain corresponds to the first and second gains for respectively a first and a second set of current measurement samples taken during a transition phase extending from the first current threshold value to the second current threshold value.

In an embodiment, the transition phase is divided into N sub-transition phases. A first sub-transition phase is the sub-transition phase just above the first current threshold value. A last sub-transition phase is the sub-transition phase just below the second current threshold value. At least 90% of 100/N %, and preferably around 100/N % of the current measurement samples are taken during the first sub-transition phase with the second gain while the rest of the current measurement samples are taken during the first sub-transition phase with the first gain. At least 90% of 100/N %, and preferably around 100/N % of the current measurement samples are taken during the last sub-transition phase with the first gain while the rest of the current measurement samples are taken during the last sub-transition phase with the second gain.

FIG. 1 shows a simplified block diagram of a control circuit 10 for an electric motor having at least one phase according to an embodiment. The control circuit 10 comprises a low voltage subcircuit 12a, a high voltage subcircuit 12b and an isolation barrier 50 between the low voltage and high voltage subcircuits 12a, 12b. The low voltage subcircuit 12a has a digital signal processor 15 comprising a current controller 16. The digital signal processor can optionally be replaced by a programmable logic element such as a field programmable gate array (FPGA). The current controller 16 may comprise for example a PI controller 17 and a comparator 18 to output a PWM signal. The PI controller 17 is adapted to correct an error value based on a reference signal $I_{ref}$ and a feedback measurement value. A PID controller may however be used instead of the PI controller in an alternative embodiment.

Figure 2:
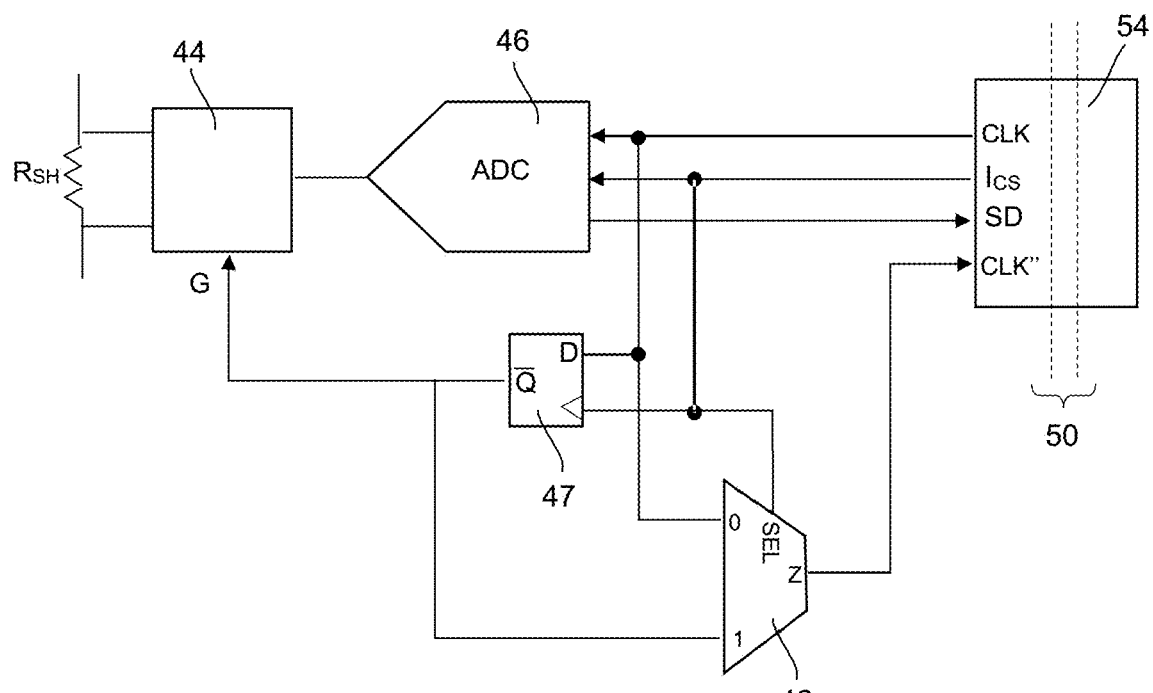
FIG. 2 shows an electronic circuit diagram of a gain selector according to an embodiment.

The high voltage subcircuit 12b comprises a power bridge 40 to control the electric motor, a current sensor 42 for measuring the current flowing in the at least one phase of the electric motor when operating, an analog-front-end 44 for signal conditioning of the current signal to exploit the full input range of an analog-digital converter (ADC) 46. The current sensor 42 is preferably a shunt resistance Rsh (FIG. 2). The current builds up a voltage across the shunt resistance Rsh. This voltage is then amplified by the analog front-end 44 and digitally converted by the ADC 46.

The isolation barrier 50 is an essential element for safety reasons. The isolation barrier comprises a gate driver 52 to produce a high-current drive input for the gate of the transistors of the power bridge 40 and an isolator 54 so that the serial data outputted by the ADC 46 may cross the isolation barrier 50. The gate driver 52 and isolator 54 may comprise for example transformers, optocouplers or capacitive couplers to create the isolation barrier between the low and high voltage subcircuits 12a, 12b.

Figure 5:
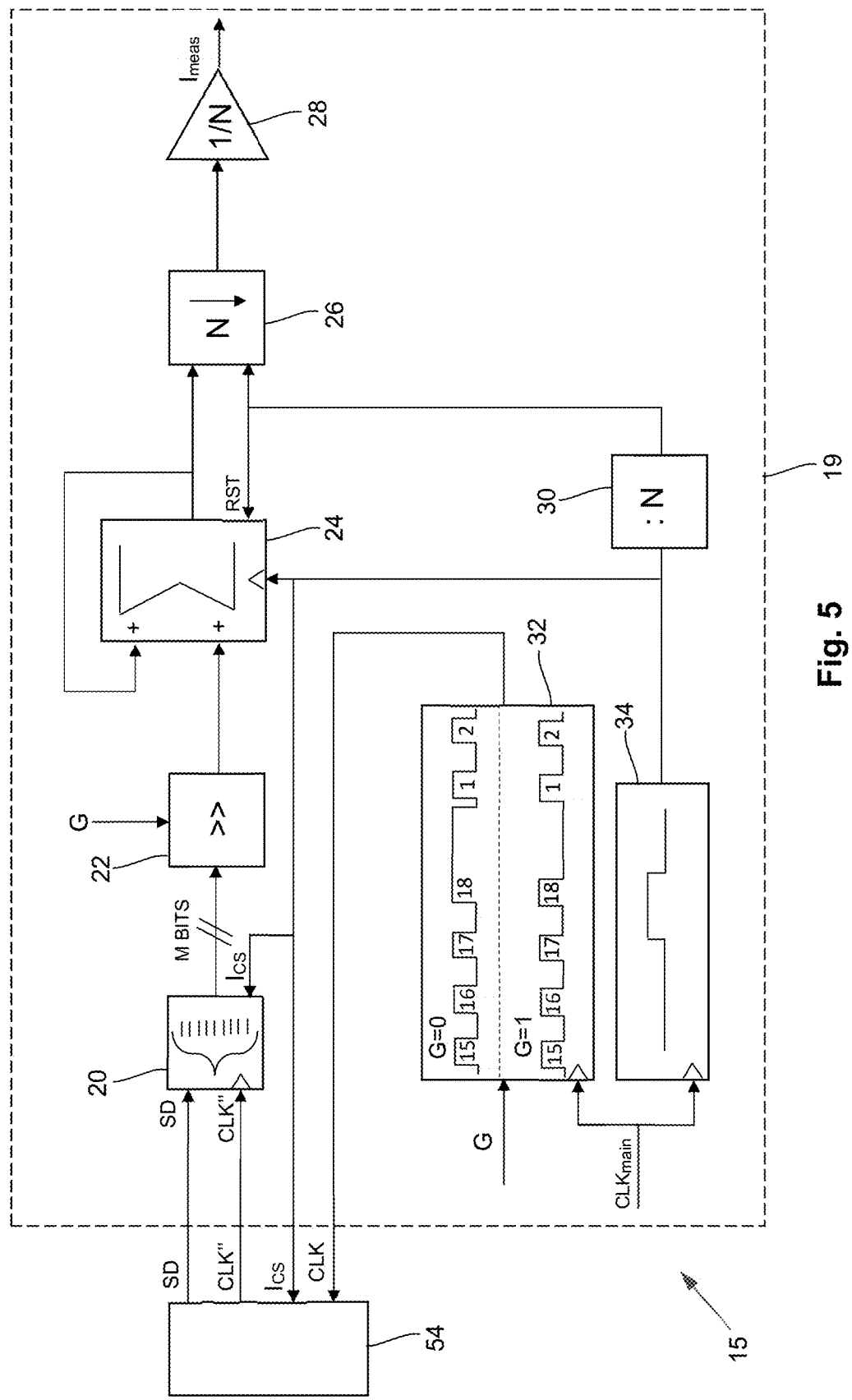
FIG. 5 shows a feedback loop used in the digital signal processor of FIG. 1 according to an embodiment to prevent the abrupt changes of the output voltage at the transition phases from the low to the high gain driving modes and vice versa shown in FIG. 4.

With reference to FIG. 2, the isolator 54 comprises only four channels which has the advantage of being cost effective and having a reduced footprint in comparison with other isolators with higher numbers of channels. Two of the four channels are used to pass a clock signal CLK and a control signal $I_{CS}$ from the low to the high voltage subcircuits 12a, 12b. The clock signal CLK and the control signal $I_{CS}$ are generated respectively by a clock generator 32 and a control signal generator 34 of the digital signal processor 15 as shown in FIG. 5.

The other two channels are used to pass a serial data signal SD outputted by the ADC 46 and a clock signal CLK", which is a replica of the above clock signal CLK, back to the low voltage circuit 12a to synchronize the clock signal in the low voltage side of the control circuit with the serial data outputted by the ADC 46 in order to avoid the risk of desynchronisation between the data and the clock due to isolation barrier delays.

It must be noted that when the motor is at standstill or operating at constant speed, the current levels are significantly smaller than current usually required during acceleration phases of the motor. In addition, a low noise level on the current outputted by the control circuit 10 is required when the motor is at standstill. The control circuit 10 is therefore adapted to switch the gain of the analog front-end 44 such that the motor is driven either in a low or high gain driving mode as a function of the current measured by the current sensor 42.

The control circuit 10 is configured, on the one hand, to set the analog front-end 44 in a high gain driving mode when current flowing in one phase of the electric motor measured by the current sensor 42 is below a first current threshold in order to reduce the LSB size and, on the other hand, to set the analog front-end 44 in a low gain driving mode, when the current flowing in said one phase measured by the current sensor exceeds a second current threshold, in order to reach the maximum current level to achieve optimal dynamic performances.

Therefore, a high or low gain information coded on one bit (G=1 or 0) must also be transferred across the isolation barrier via the isolator 54, despite the constraint in terms of limited channels, in order to set the analog front-end 44 in the low or high gain driving mode.

The electronic circuit diagram, illustrated in FIG. 2, is adapted to pass such high or low gain information. To this end, the high voltage subcircuit 12b of the control circuit 10 of FIG. 1 further comprises a D flip-flop 47 and a multiplexer 48 arranged to control the gain of the analog front-end 44 as a function of current measurement samples. More particularly, the clock signal CLK and the control signal $I_{CS}$ generated by respectively a clock generator 32 and a control signal generator 34 of the digital signal processor 15 as shown in FIG. 5, may cross the isolation barrier 50 from the low voltage side to the high voltage side of the control circuit 10 via respectively the first and the second channel of the isolator 54.

Figure 3A:
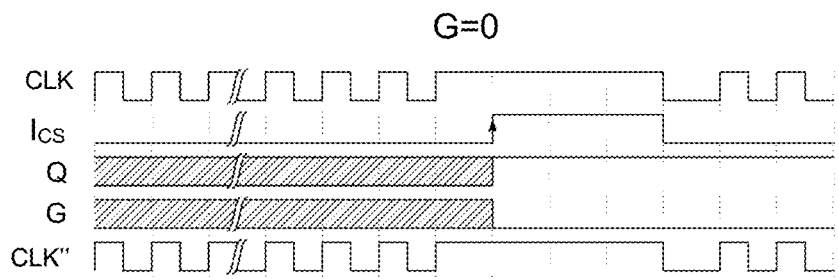
FIG. 3a is a serial data frame for selecting a gain of a first gain driving mode.
Figure 3B:
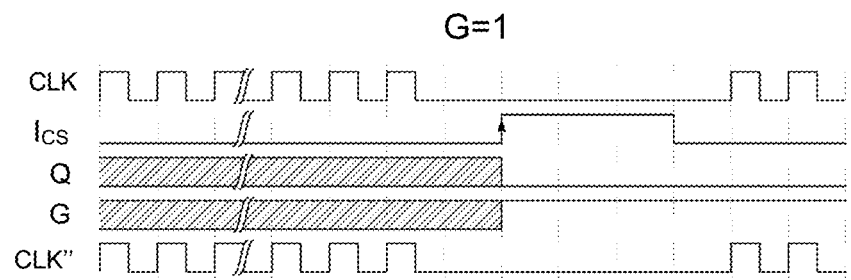
FIG. 3b is a serial data frame for selecting a gain of a second gain driving mode.

The serial data SD outputted by the ADC 46 may cross the isolation barrier 50 from the high voltage side to the low voltage side of the control circuit 10 via the third channel. The clock input of the D flip-flop 47 is arranged to receive the control signal $I_{CS}$ and the input of the D flip-flop 47 is arranged to receive the clock signal CLK. The inverted output of the D flip-flop which has been named G, represented in FIGS. 3a and 3b, is used for selection of a low gain or a high gain of the analog front-end 44 as a function of the current measured by the current sensor 42. In the electronic circuit diagram illustrated in FIG. 2, the inverted output of the D flip-flop has been used for the selection of gain, but the non-inverted output could also have been used depending on the circuit design.

In other words, the signals are swapped, in such a way that the control signal $I_{CS}$ is used as the clock input of the D flip-flop, whereas the clock is used as the input to be sampled. Typically, the output of the D flip-flop is in a "zero"

state (G=0) to set the analog front-end 44 to the high gain driving mode for low currents and where position stability is crucial, whereas the output of the D flip-flop is in a "one" state (G=1) to set the analog front-end 44 to the low gain driving mode for dynamic acceleration phases of the electric motor.

The electronic circuit diagram of FIG. 2 further comprises a multiplexer 48 comprising two inputs and a selector input SEL. One input of the multiplexer 48 is arranged to receive the clock signal CLK while the other input of the multiplexer 48 is arranged to receive the output of the D flip-flop 47. The selector input SEL is arranged to receive the control signal $I_{CS}$ such that either the selected gain G or the replicated clock signal CLK" may pass via the fourth channel of the isolator 54 from the high voltage side to the low voltage side of the control circuit based on the state of the control signal $I_{CS}$. Typically, the selected gain G will pass through the multiplexer when the control signal $I_{CS}$ is in high state ($I_{CS}$=1), and the replicated clock signal CLK" will pass through the multiplexer when the control signal $I_{CS}$ is in low state ($I_{CS}$=0). This allows conditioning of the signal in the low voltage subcircuit 12a as a function of the selected gain G, as described in detail subsequently with reference to FIG. 5.

Figure 4:
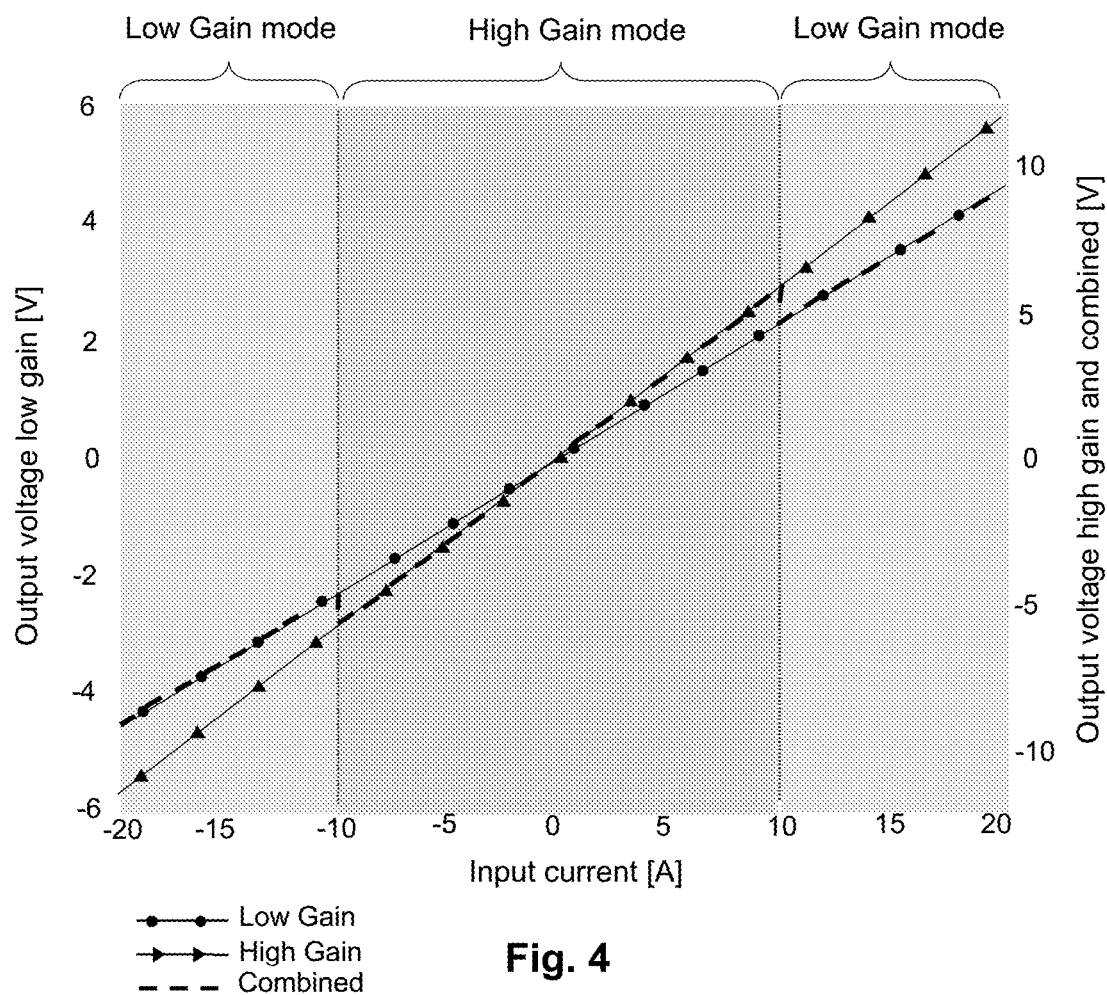
FIG. 4 is a graph showing abrupt changes of the output voltage at the transition from a low gain to a high gain driving mode and at the transition from the high gain to the low gain driving modes.

The low and high gain driving modes are used as a function of the intensity of load current of the electric motor to exploit the benefits of both driving modes as already mentioned above. For example, let us assume that a ratio of two has been foreseen by design between the high gain mode and the low gain mode. Indeed, any power of two is optimal to be able to use a simple register shifter 22 in the subsequent signal processing. However, in practice, an exact gain of two is never obtained due to the tolerances on the values of electronic components. Therefore, in the current range around the threshold it is necessary to make a smooth transition from the low gain driving mode to the high gain driving mode and vice versa to prevent abrupt changes, as shown in FIG. 4, resulting in torque and speed ripples.

FIG. 5 shows an optimized feedback loop 19 used in the digital signal processor 15 of FIG. 1 according to an embodiment to prevent the abrupt changes of the output voltage during the transition phases from the low to the high gain driving modes and vice versa. The feedback loop 19 comprises a deserializer 20, a register shifter 22, an accumulator 24, a decimator filter 26 and a division element 28.

The deserializer 20 is arranged to receive serial data SD from the ADC 46 as an input. The serial data SD are transmitted one bit at a time in a serial manner and synchronized on the clock CLK". These bits are parallelized to create a single value encoded on M bits.

The register shifter 22 is used for changing the value if the current measurement has been performed with a gain different from the low gain in the analog front-end 44 to ensure that the values accumulated in the accumulator 24 are coherent and in the same range. The register shifter 22 is therefore controlled by an input signal G. When G is in "one" state, the register shifter 22 is inactive, whereas when G is in "zero" state, the register shifter 22 shifts the bits in the register by one or more positions to the right so that the value is coherent with the current measurements. Shifting one bit to the right is equivalent to dividing the value (encoded in binary format) by two. This is why the ratio between the high gain mode and the low gain mode is typically designed to be a power of two, and the same exponent is used as the number of positions to shift the register in the shifter 22.

Oversampling technique is used to increase the smoothness during the transition phases between the low and high gain driving modes and vice versa so as to suppress, or at least reduce, torque and speed ripples that occur during these transition phases as shown in FIG. 4. Accordingly, the accumulator 24 is arranged to add up different samples of currents measured by the current sensor 42. The decimator filter 26 is used for downsampling the current samples (keeping only every Nth sample), and the accumulator 24 is reset at this moment. A reset module 30 is foreseen to count samples and send a single pulse when the number N is reached. This pulse is used both by the decimator filter 26 to latch the current value of the output of the accumulator, and by the accumulator 24 to reset its value to zero.

Figure 7A:
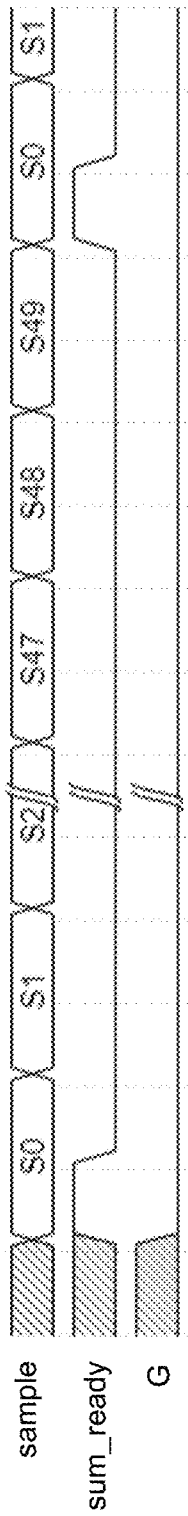
FIG. 7a is a time diagram corresponding to the high gain driving mode.
Figure 7B:
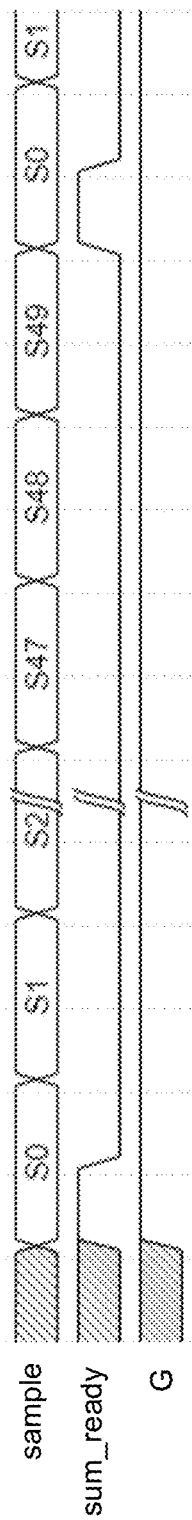
FIG. 7b is a time diagram corresponding to the low gain driving mode.
Figure 7C:
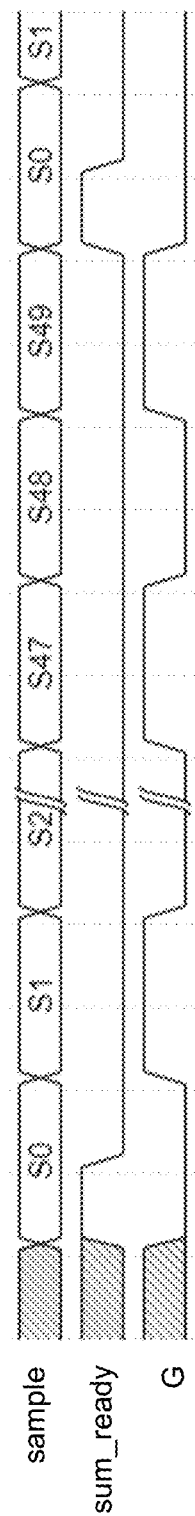
FIG. 7c shows a time diagram corresponding to a transition mode in which 50% of current measurement samples are taken during the low gain driving mode and 50% of current measurement samples are taken during the high gain driving mode.

In the exemplary embodiment shown in FIGS. 7a to 7c, the reset module 30 is set up to count fifty samples and generate the pulse signal (SUM_Ready) for the accumulator in such a way that it adds up 50 current measurement samples and the decimator filter 26 latches the sum upon completion of the addition of the 50 measurement samples. The decimator filter 26 transmits the accumulated value to the division element 28 for outputting a moving average of the current measurement for each oversampled measurement made of 50 current measurement samples.

The clock generator 32 of the digital processing unit, as shown in FIG. 5, is arranged to generate a first or a second clock signal CLK as a function of the selected gain G which is determined based on the previous current measurement. The control signal generator 34 is arranged to generate the control signal $I_{CS}$ so as to initiate an analog to digital conversion in the ADC and select the gain of the analog front-end 44 as previously described in relation to FIGS. 2, 3a and 3b. The first and second clock signal CLK and control signal $I_{CS}$ are derived from a main cock $CLK_{main}$ generated by the digital processing unit 15.

Figure 6A:
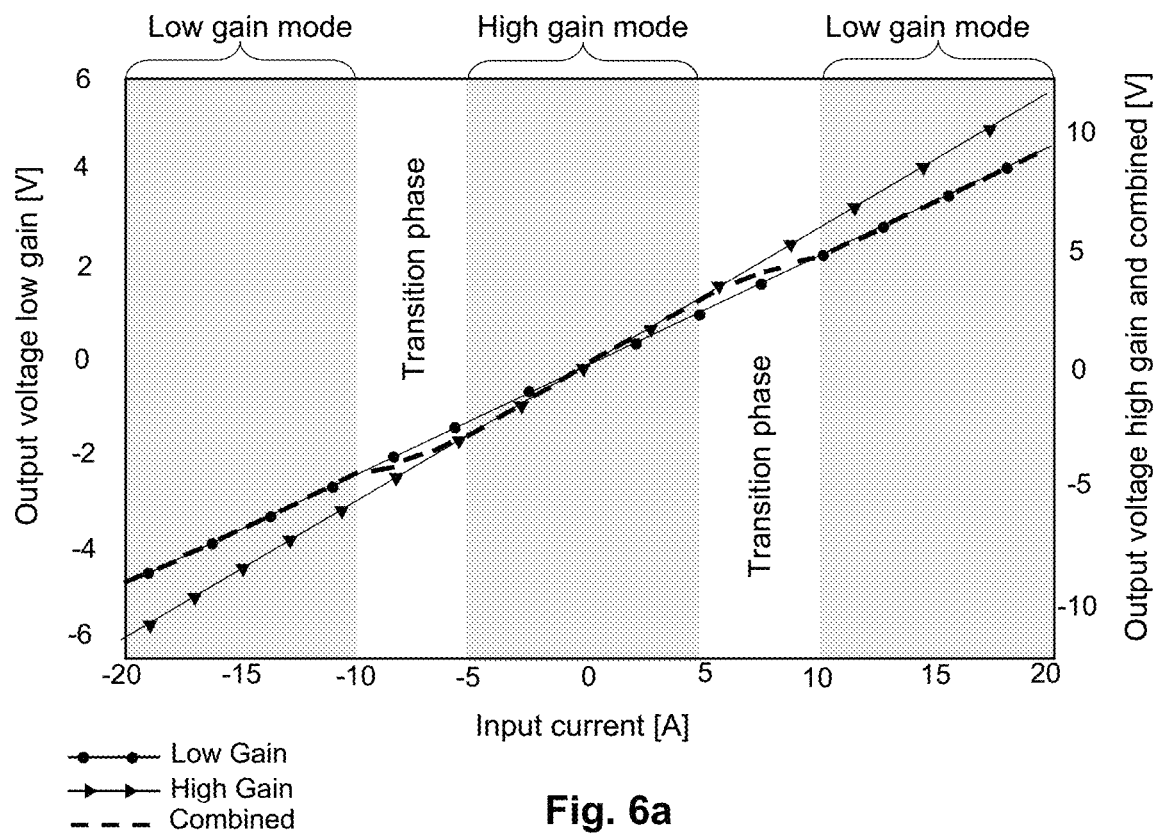
FIG. 6a is a graph showing a first smoother transition of the output voltage from the low to the high gain driving modes during a first transition phase when the current changes from −10 A to −5 A, and a second smoother transition of the output voltage from the high to the low gain driving modes during a second transition phase when the current changes from 5 A to 10 A when using the feedback loop of FIG. 5.
Figure 6B:
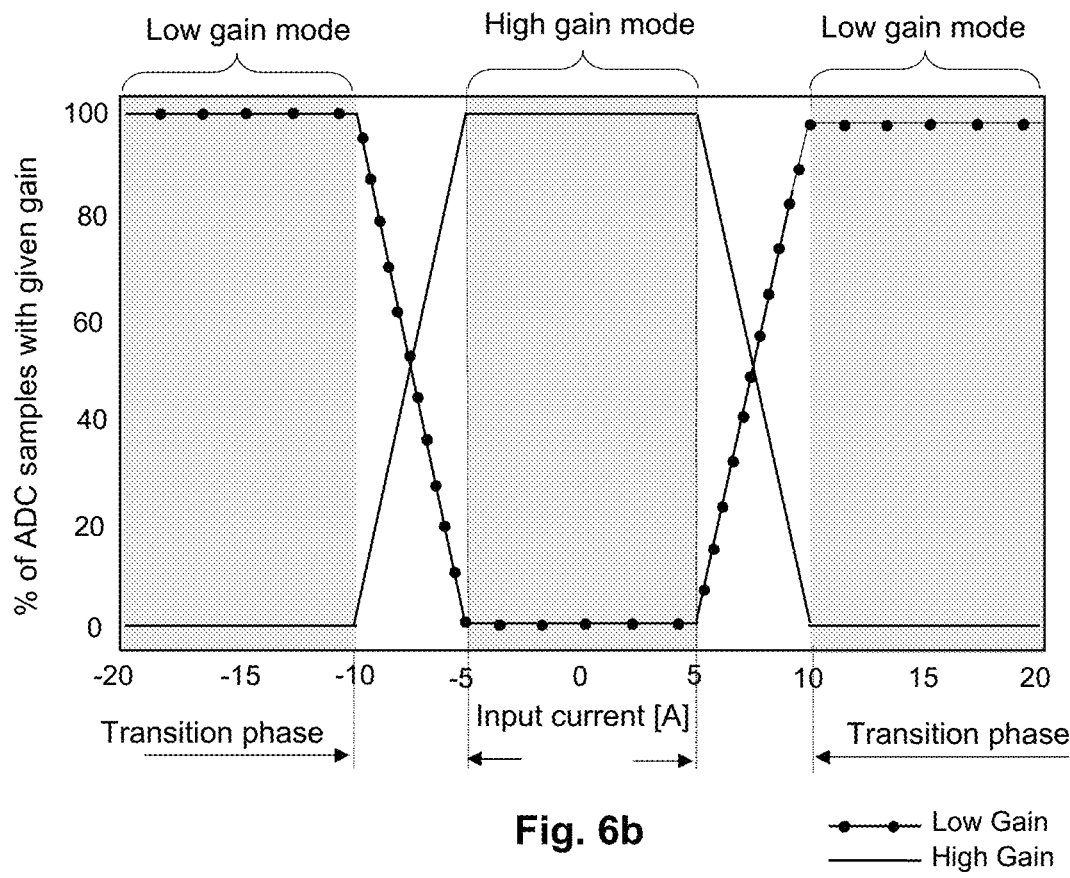
FIG. 6b is a graph showing ADC samples with low and high gain modes percentages during respective first and second transition phases.

FIG. 6a shows a smoother variation of the output voltage from the low to the high gain driving modes during a first transition phase when the current changes from −10 [A] to −5 [A], as well as a smoother variation of the output voltage from the high to the low gain driving modes during a second transition phase when the current changes from 5 [A] to 10 [A] when using the feedback loop of FIG. 5. During the first and second transition phases, the number of ADC samples that are in low or high gain driving mode depends linearly on the previous current measurement as shown in FIG. 6b. In this way it is possible to smooth out the transition and to avoid abrupt changes.

More particularly, as illustrated in FIG. 6b, each current measurement sample having a value ranging from −20 [A] to −10 [A] and from 10 [A] to 20 [A] has been performed when the analog front-end 44 was set to a low gain driving mode while each current measurement sample having a value ranging from −5 [A] to +5 [A] has been performed when the analog front-end 44 was set to a high gain driving mode. During the first and second transition phases ranging from −10 [A] to −5 [A] and from 5 [A] to 10 [A] respectively, a certain percentage of current measurement samples have been performed in the low gain driving mode, while the rest of the current measurement samples have been performed in the high gain driving mode to add up to 100%.

One would indeed see from the first transition phase of FIG. 6b that the percentage of the current measurement samples made in the low gain driving mode is high at the very beginning of this first transition phase and linearly decreased such that around 80%, 60%, 40% and 20% of the current measurement samples are performed in the low gain driving mode while the respective remaining 20%, 40%, 60% and 80% of the current measurement samples are performed in the high gain driving mode for a current of around −9 [A], −8 [A], −7 [A] and −6 [A] respectively.

Likewise, one would see from the second transition phase of FIG. 6b that the percentage of the current measurement samples made in the low gain driving mode is low at the very beginning of this second transition phase and linearly increased such that around 20%, 40%, 60% and 80% of the current measurement samples are performed in the low gain driving mode while the respective remaining 80%, 60%, 40% and 20% of the current measurement samples are performed in the high gain driving mode for a current of around +6 [A], +7 [A], +8 [A] and +9 [A] respectively.

The order in which the current measurement samples are performed in the first and second high gain driving mode does not impact the output of the control circuit 10. For example, for current measurement samples of around +7 [A], the current measurements samples that made up the 60% of samples taken in the low gain driving mode can be added together by the accumulator 24 in a row and the 40% of samples taken in the low gain driving mode can be added together thereafter or they can be mixed together without any predefined order considering that the sequence of order of the low and high driving modes does not have any effect on the moving average of the current measurement calculated by the division element 28.

FIGS. 7a to 7c show three different time diagrams for different operating conditions. In FIG. 7a, each oversampled measurement is made of 50 ADC samples S0, S1, S2 [ . . . ] in the high gain driving mode, that is to say, in the particular case shown in FIGS. 6a and 6b, when the current load measured by the current sensor is in the range between −5 [A] and +5 [A]. When working in this region, the amplifier noise is minimised, but only low currents can be measured (up to ±5 [A] in the example above).

FIG. 7b shows the timing diagram for the low gain driving mode. The gain never changes and the control signal G is set to the "one" state. This is the gain driving mode used when the current is inferior to −10 [A] or exceeds +10 [A].

FIG. 7c shows the timing diagram during the first or second transition phases of FIG. 6b during which 50% of the current measurement samples are performed in the low gain driving mode and 50% of the current measurement samples are performed in the high gain driving mode for a current of −7.5 [A] or +7.5 [A]. In this particular example, the current measurement samples are performed in the low and high gain driving modes in an alternate fashion.

Various modifications and variations to the described embodiments of the invention will be apparent to those skilled in the art without departing from the scope of the invention as defined in the appended claims. For example, the control circuit 10 may be adapted to control a single-phase or multiple phase AC motor, for instance a three-phase AC motor. In the latter case, the control circuit may comprise three feedback loops as shown in FIGS. 1 and 5 for adjusting the current in each phase of the electric motor.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE LIST

Control circuit 10
  Low voltage subcircuit 12a
    Digital signal processor 15
      Current controller 16
        PI controller 17
        Comparator 18
      Control loop 19
        Deserializer 20
        Register shifter 22
        Accumulator 24
        Decimator filter 26
        Division element 28
        Reset module 30
        Clock generator 32
        Control signal generator 34
  High voltage subcircuit 12b
    Power bridge 40
    Current sensor 42
    Analog Front-End 44
    ADC converter 46
    Flip-Flop 47
    Multiplexer 48
  Isolation barrier 50
    Gate driver 52
    Isolator 54
  Control signal $I_{CS}$
    Gain selector signal G
    Serial data SD
    Shunt resistance Rsh
    Clock signal CLK
    Clock signal replica CLK"

What is claimed is:

1. A control circuit for an electric motor having at least one phase, the control circuit comprising:
a low voltage subcircuit comprising a current controller configured to generate a driving signal, and a feedback loop having an output that is fed back to an input of the current controller;
a high voltage subcircuit comprising a power bridge arranged to output a current that drives the at least one phase of the motor, a current sensor arranged to measure the current in the at least one phase of the motor, an analog front-end arranged to amplify a voltage built up by the current across the current sensor and an analog-to-digital converter (ADC) arranged to digitally convert the voltage amplified by the analog front-end, the analog front-end being configured to apply a first gain or a second gain that is higher than the first gain as a function of the current in the at least one phase measured by the current sensor; and an isolation barrier disposed between the low voltage and high voltage subcircuits, the isolation barrier comprising an isolator arranged to receive an output signal of the ADC and pass the output signal across the isolation barrier from the high voltage subcircuit to the low voltage subcircuit, wherein the isolator comprises:
a first and a second channel to pass respectively a clock signal and a control signal from the low voltage subcircuit to the high voltage subcircuit to select the first or second gain of the analog front-end, and
a third and a fourth channel to pass respectively the output signal of the ADC and a replica of the clock signal from the high voltage subcircuit to the low voltage subcircuit,
wherein the high voltage subcircuit further comprises a D flip-flop, wherein a clock input of the D flip-flop is arranged to receive the control signal from the second channel and an input of the D flip-flop is arranged to receive the clock signal from the first channel, and wherein an output of the D flip-flop is connected to the analog front-end so as to be useable for selection of the first or the second gain of the analog front-end.

2. The control circuit according to claim 1, the high voltage subcircuit further comprising a multiplexer comprising two inputs and a selector input, wherein one of the two inputs is arranged to receive the clock signal, the other of the two inputs is arranged to receive the output of the D-flip-flop and the selector input is arranged to receive the control signal such that either the selected gain or the replica of the clock signal can be passed via the fourth channel of the isolator based on the state of the control signal.

3. The control circuit according to claim 1, wherein the feedback loop of the low voltage subcircuit comprises a deserializer arranged to receive serial data from the ADC, representing a current value measured by the current sensor, as an input to convert the serial data into a single value encoded on M bits, and a register shifter configured to change the value of the M bits in a case that the selected gain differs from a gain applied to the current value.

4. The control circuit according to claim 3, the feedback loop further comprising an accumulator arranged to add up different samples of currents measured by the current sensor, a decimator filter configured to sample N current samples and a division element configured to output a moving average of the current measurement.

5. The control circuit according to claim 4, wherein the feedback loop further comprises a clock generator arranged to generate a first or a second clock signal as a function of the selected gain which is based on the current measured by the current sensor.

6. The control circuit according to claim 5, wherein the clock generator is configured to adapt the first and second clock signal, when the current measured by the current sensor is between a first and a second current threshold value, such that a moving average of the current measurement outputted by the division element is made up of current samples measured with the first gain and current samples measured with the second gain during a transition phase from a low to a high gain driving mode or from a high to a low gain driving mode.

7. The control circuit according to claim 1, wherein the isolation barrier comprises a gate driver arranged to receive the driving signal from the low voltage subcircuit and pass the driving signal to the power bridge.

8. A device comprising an electric motor having a control circuit, the control circuit comprising:
a low voltage subcircuit comprising a current controller configured to generate a driving signal, and a feedback loop having an output that is fed back to an input of the current controller;
a high voltage subcircuit comprising a power bridge arranged to output a current that drives the at least one phase of the motor, a current sensor arranged to measure the current in the at least one phase of the motor, an analog front-end arranged to amplify a voltage built up by the current across the current sensor and an analog-to-digital converter (ADC) arranged to digitally convert the voltage amplified by the analog front-end, the analog front-end being configured to apply a first gain or a second gain that is higher than the first gain as a function of the current in the at least one phase measured by the current sensor; and
an isolation barrier disposed between the low voltage and high voltage subcircuits, the isolation barrier comprising an isolator arranged to receive an output signal of the ADC and pass the output signal across the isolation barrier from the high voltage subcircuit to the low voltage subcircuit, wherein the isolator comprises:
a first and a second channel to pass respectively a clock signal and a control signal from the low voltage subcircuit to the high voltage subcircuit to select the first or second gain of the analog front-end, and
a third and a fourth channel to pass respectively the output signal of the ADC and a replica of the clock signal from the high voltage subcircuit to the low voltage subcircuit,
wherein the high voltage subcircuit further comprises a D flip-flop, wherein a clock input of the D flip-flop is arranged to receive the control signal from the second channel and an input of the D flip-flop is arranged to receive the clock signal from the first channel, and wherein an output of the D flip-flop is connected to the analog front-end so as to be useable for selection of the first or the second gain of the analog front-end.

9. A method for controlling a control circuit for an electric motor, the method comprising:
measuring a current flowing in the at least one phase of the electric motor, and
controlling an analog front-end such that a gain of the analog front-end:
i) corresponds to the first gain as long as the current measured is below a first current threshold value,
ii) corresponds to the second gain as long as the current measured is above a second current threshold value, and
iii) corresponds to the first and second gain for respectively a first and a second set of current measurement samples taken during a transition phase extending from the first current threshold value to the second current threshold value,
wherein the transition phase is divided into N sub-transition phases, a first sub-transition phase being a sub-transition phase just above the first current threshold value, and a last sub-transition phase is a sub-transition phase just below the second current threshold value, wherein at least 90% of 100/N % of the current measurement samples are taken during the first sub-transition phase with the second gain while the rest of the current measurement samples are taken during the first sub-transition phase with the first gain, and wherein at least 90% of 100/N % of the current measurement samples are taken during the last sub-transition phase with the first gain while the rest of the current measurement samples are taken during the last sub-transition phase with the second gain.

10. The method according to claim 9, wherein the control circuit comprises:

a low voltage subcircuit comprising a current controller configured to generate a driving signal, and a feedback loop having an output that is fed back to an input of the current controller;

a high voltage subcircuit comprising a power bridge arranged to output a current that drives the at least one phase of the motor, a current sensor arranged to measure the current in the at least one phase of the motor, the analog front-end, which is arranged to amplify a voltage built up by the current across the current sensor, and an analog-to-digital converter (ADC) arranged to digitally convert the voltage amplified by the analog front-end, the analog front-end being configured to apply a first gain or a second gain that is higher than the first gain as a function of the current in the at least one phase measured by the current sensor; and an isolation barrier disposed between the low voltage and high voltage subcircuits, the isolation barrier comprising an isolator arranged to receive an output signal of the ADC and pass the output signal across the isolation barrier from the high voltage subcircuit to the low voltage subcircuit, wherein the isolator comprises:

a first and a second channel to pass respectively a clock signal and a control signal from the low voltage subcircuit to the high voltage subcircuit to select the first or second gain of the analog front-end, and a third and a fourth channel to pass respectively the output signal of the ADC and a replica of the clock signal from the high voltage subcircuit to the low voltage subcircuit.

11. The method according to claim 10, wherein the high voltage subcircuit further comprises a D flip-flop, wherein a clock input of the D flip-flop is arranged to receive the control signal from the second channel and an input of the D flip-flop is arranged to receive the clock signal from the first channel, and wherein an output of the D flip-flop is connected to the analog front-end so as to be useable for selection of the first or the second gain of the analog front-end.

12. The method according to claim 10, wherein the isolation barrier comprises a gate driver arranged to receive the driving signal from the low voltage subcircuit and pass the driving signal to the power bridge.

* * * * *